(12) United States Patent
Dvorak et al.

(10) Patent No.: US 12,439,514 B2
(45) Date of Patent: Oct. 7, 2025

(54) ELECTRONIC DEVICE HAVING CONDUCTIVE CONTACT SOLDERED TO PRINTED CIRCUIT

(71) Applicant: Apple Inc., Cupertino, CA (US)

(72) Inventors: Peter A Dvorak, Menlo Park, CA (US); Eric W Bates, San Jose, CA (US); Ana Papio Toda, San Jose, CA (US); Yiren Wang, Cupertino, CA (US); Hao Xu, Cupertino, CA (US); Yuan Tao, Santa Clara, CA (US); Han Wang, Campbell, CA (US); Jack R Lanzi, San Francisco, CA (US); Ronald Lam, Berkeley, CA (US)

(73) Assignee: Apple Inc., Cupertino, CA (US)

( * ) Notice: Subject to any disclaimer, the term of this patent is extended or adjusted under 35 U.S.C. 154(b) by 126 days.

(21) Appl. No.: 18/458,747

(22) Filed: Aug. 30, 2023

(65) Prior Publication Data
US 2024/0080976 A1    Mar. 7, 2024

Related U.S. Application Data

(60) Provisional application No. 63/404,059, filed on Sep. 6, 2022.

(51) Int. Cl.
*H05K 1/02* (2006.01)
*H05K 1/11* (2006.01)
(Continued)

(52) U.S. Cl.
CPC .............. *H05K 1/11* (2013.01); *H05K 1/028* (2013.01); *H05K 1/181* (2013.01); *H05K 5/0217* (2013.01); *H05K 7/1427* (2013.01); *H04R 1/02* (2013.01); *H04R 2499/11* (2013.01); *H05K 2201/0141* (2013.01); *H05K 2201/10098* (2013.01); *H05K 2201/10128* (2013.01)

(58) Field of Classification Search
CPC ................................. H05K 1/11; H05K 1/028
See application file for complete search history.

(56) References Cited

U.S. PATENT DOCUMENTS

| 5,281,770 A | 1/1994 | Kamei et al. |
| 10,886,644 B2 | 1/2021 | Taschner et al. |

(Continued)

FOREIGN PATENT DOCUMENTS

JP         H11251733 A      9/1999

*Primary Examiner* — Sherman Ng
(74) *Attorney, Agent, or Firm* — Treyz Law Group, P.C.; Michael H. Lyons

(57) ABSTRACT

An electronic device may be provided with a liquid crystal polymer (LCP) printed circuit having conductive trace and a hole. A conductive flange may be soldered to the conductive trace and may extend into the hole. The end of the conductive flange may laterally surround a central opening within the hole. A conductive contact may be inserted into the central opening. Solder may be deposited over the conductive flange and in the central opening. The solder may couple the conductive contact to the conductive flange and thus the conductive trace. This may ensure a robust mechanical and electrical connection between the conductive contact and the conductive trace on the printed circuit despite the printed circuit being formed from LCP, which may not support copper-plated through vias for coupling to the conductive contact.

19 Claims, 9 Drawing Sheets

(51) Int. Cl.
*H05K 1/18* (2006.01)
*H05K 5/02* (2006.01)
*H05K 7/14* (2006.01)
*H04R 1/02* (2006.01)

(56) References Cited

U.S. PATENT DOCUMENTS

| | | |
|---|---|---|
| 2018/0069297 A1 | 3/2018 | Jin et al. |
| 2019/0074586 A1 | 3/2019 | Ruaro et al. |
| 2019/0097331 A1 | 3/2019 | Smith et al. |
| 2019/0116502 A1* | 4/2019 | Guo .................... H01Q 21/065 |

* cited by examiner

ELECTRONIC DEVICE HAVING CONDUCTIVE CONTACT SOLDERED TO PRINTED CIRCUIT

This application claims the benefit of U.S. Provisional Patent Application No. 63/404,059, filed Sep. 6, 2022, which is hereby incorporated by reference herein in its entirety.

BACKGROUND

This relates generally to electronic devices and, more particularly, to electronic devices with conductive paths for electrical components.

Electronic devices such as portable computers and cellular telephones are often provided with electrical components. Conductive paths are often coupled between the electrical components. The conductive paths convey signals for the electronic components.

It can be challenging to provide conductive paths that form reliable and secure electrical connections between electronic components.

SUMMARY

An electronic device may be provided with a flexible printed circuit that includes liquid crystal polymer (LCP). The flexible printed circuit may have a hole. A conductive trace may be patterned on the flexible printed circuit. A conductive flange may be soldered to the conductive trace. An end of the conductive flange may extend into the hole. The end of the conductive flange may be separated from a sidewall of the hole by a gap having a non-zero distance. The end of the conductive flange may laterally surround a central opening within the hole. The end of the conductive flange may be laterally interposed between the central opening and the gap.

A conductive contact may be inserted into the central opening. Solder may be deposited over the conductive flange and in the central opening. The solder may couple the conductive contact to the conductive flange and thus the conductive trace. This may ensure a robust mechanical and electrical connection between the conductive contact and the conductive trace on the flexible printed circuit despite the flexible printed circuit being formed from LCP, which does not support copper-plated through vias for coupling to the conductive contact.

The conductive contact may, for example, include a conductive spring that couples a ground trace on the printed circuit to a mid-chassis of the device. The conductive spring, the ground trace, and the mid-chassis may form part of an antenna ground for an antenna. Additionally or alternatively, the conductive contact may include a conductive lead for a speaker driver. The conductive trace, the conductive lead, and the conductive flange may convey audio signals to the speaker driver, which produces acoustic sound based on the audio signals.

DETAILED DESCRIPTION

Figure 1:
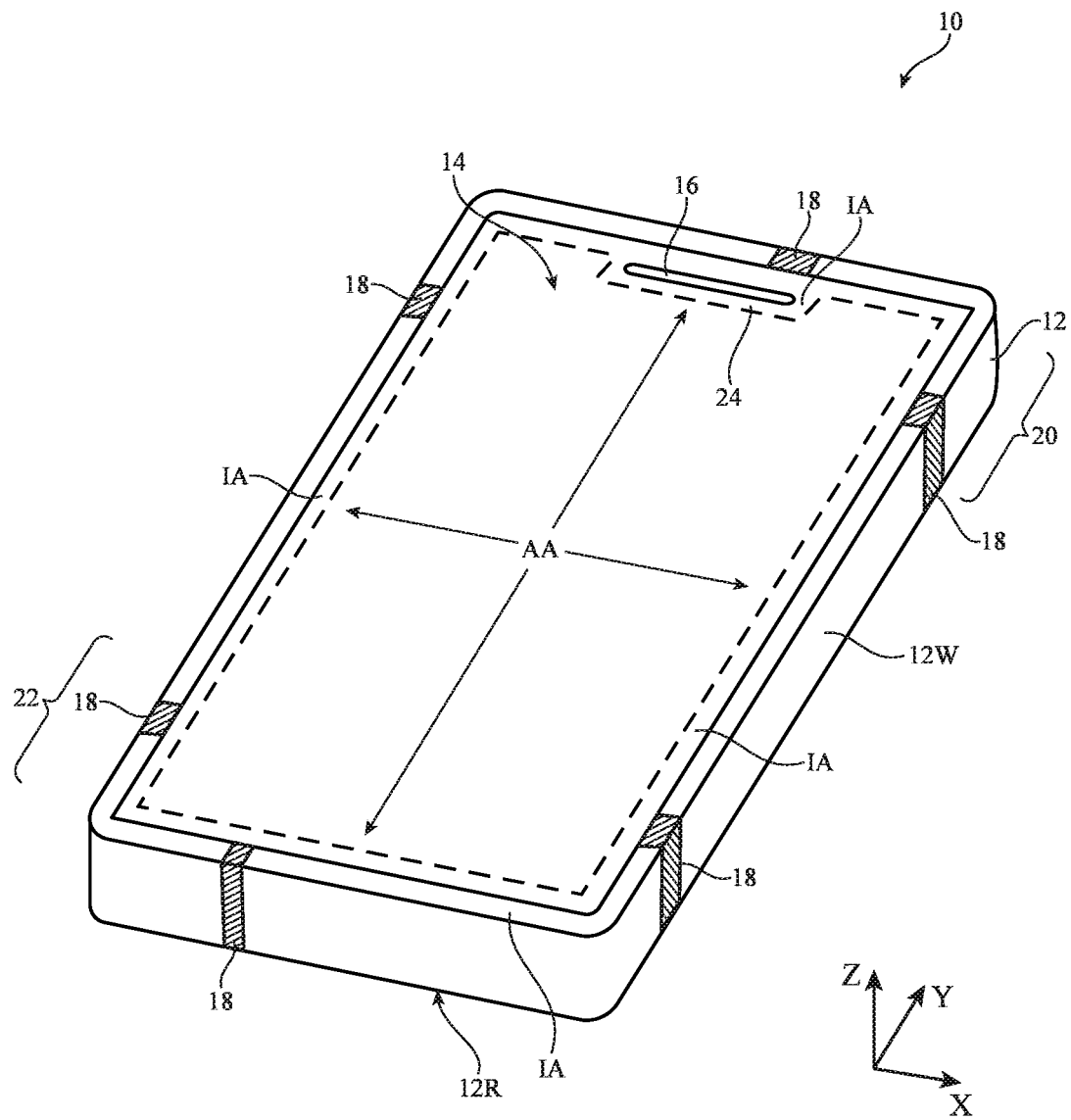
FIG. 1 is a perspective view of an illustrative electronic device in accordance with some embodiments.

An electronic device such as electronic device 10 of FIG. 1 may be provided with wireless circuitry that includes antennas. The antennas may be used to transmit and/or receive wireless radio-frequency signals.

Device 10 may be a portable electronic device or other suitable electronic device. For example, device 10 may be a laptop computer, a tablet computer, a somewhat smaller device such as a wrist-watch device, pendant device, headphone device, earpiece device, headset device, or other wearable or miniature device, a handheld device such as a cellular telephone, a media player, or other small portable device. Device 10 may also be a set-top box, a desktop computer, a display into which a computer or other processing circuitry has been integrated, a display without an integrated computer, a wireless access point, a wireless base station, an electronic device incorporated into a kiosk, building, or vehicle, or other suitable electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may, if desired, have a display such as display 14. Display 14 may be mounted on the front face of device 10. Display 14 may be a touch screen that incorporates capacitive touch electrodes or may be insensitive to touch. The rear face of housing 12 (i.e., the face of device 10 opposing the front face of device 10) may have a substantially planar housing wall such as rear housing wall 12R (e.g., a planar housing wall). Rear housing wall 12R may have slots that pass entirely through the rear housing wall and that therefore separate portions of housing 12 from each other. Rear housing wall 12R may include conductive portions and/or dielectric portions. If desired, rear housing wall 12R may include a planar metal layer covered by a thin layer or coating of dielectric such as glass, plastic, sapphire, or ceramic (e.g., a dielectric cover layer). Housing 12 may also have shallow grooves that do not pass entirely through housing 12. The slots and grooves may be filled with plastic or other dielectric materials. If desired, portions of housing 12 that have been separated from each other (e.g., by a through slot) may be joined by internal conductive structures (e.g., sheet metal or other metal members that bridge the slot).

Housing 12 may include peripheral housing structures such as peripheral structures 12W. Conductive portions of peripheral structures 12W and conductive portions of rear housing wall 12R may sometimes be referred to herein collectively as conductive structures of housing 12. Peripheral structures 12W may run around the periphery of device 10 and display 14. In configurations in which device 10 and display 14 have a rectangular shape with four edges, peripheral structures 12W may be implemented using peripheral housing structures that have a rectangular ring shape with four corresponding edges and that extend from rear housing wall 12R to the front face of device 10 (as an example). In other words, device 10 may have a length (e.g., measured parallel to the Y-axis), a width that is less than the length (e.g., measured parallel to the X-axis), and a height (e.g., measured parallel to the Z-axis) that is less than the width. Peripheral structures 12W or part of peripheral structures 12W may serve as a bezel for display 14 (e.g., a cosmetic trim that surrounds all four sides of display 14 and/or that helps hold display 14 to device 10) if desired. Peripheral structures 12W may, if desired, form sidewall structures for device 10 (e.g., by forming a metal band with vertical sidewalls, curved sidewalls, etc.).

Peripheral structures 12W may be formed from a conductive material such as metal and may therefore sometimes be referred to as peripheral conductive housing structures, conductive housing structures, peripheral metal structures, peripheral conductive sidewalls, peripheral conductive sidewall structures, conductive housing sidewalls, peripheral conductive housing sidewalls, sidewalls, sidewall structures, or a peripheral conductive housing member (as examples). Peripheral conductive housing structures 12W may be formed from a metal such as stainless steel, aluminum, alloys, or other suitable materials. One, two, or more than two separate structures may be used in forming peripheral conductive housing structures 12W.

It is not necessary for peripheral conductive housing structures 12W to have a uniform cross-section. For example, the top portion of peripheral conductive housing structures 12W may, if desired, have an inwardly protruding ledge that helps hold display 14 in place. The bottom portion of peripheral conductive housing structures 12W may also have an enlarged lip (e.g., in the plane of the rear surface of device 10). Peripheral conductive housing structures 12W may have substantially straight vertical sidewalls, may have sidewalls that are curved, or may have other suitable shapes. In some configurations (e.g., when peripheral conductive housing structures 12W serve as a bezel for display 14), peripheral conductive housing structures 12W may run around the lip of housing 12 (i.e., peripheral conductive housing structures 12W may cover only the edge of housing 12 that surrounds display 14 and not the rest of the sidewalls of housing 12).

Rear housing wall 12R may lie in a plane that is parallel to display 14. In configurations for device 10 in which some or all of rear housing wall 12R is formed from metal, it may be desirable to form parts of peripheral conductive housing structures 12W as integral portions of the housing structures forming rear housing wall 12R. For example, rear housing wall 12R of device 10 may include a planar metal structure and portions of peripheral conductive housing structures 12W on the sides of housing 12 may be formed as flat or curved vertically extending integral metal portions of the planar metal structure (e.g., housing structures 12R and 12W may be formed from a continuous piece of metal in a unibody configuration). Housing structures such as these may, if desired, be machined from a block of metal and/or may include multiple metal pieces that are assembled together to form housing 12. Rear housing wall 12R may have one or more, two or more, or three or more portions. Peripheral conductive housing structures 12W and/or conductive portions of rear housing wall 12R may form one or more exterior surfaces of device 10 (e.g., surfaces that are visible to a user of device 10) and/or may be implemented using internal structures that do not form exterior surfaces of device 10 (e.g., conductive housing structures that are not visible to a user of device 10 such as conductive structures that are covered with layers such as thin cosmetic layers, protective coatings, and/or other coating/cover layers that may include dielectric materials such as glass, ceramic, plastic, or other structures that form the exterior surfaces of device 10 and/or serve to hide peripheral conductive housing structures 12W and/or conductive portions of rear housing wall 12R from view of the user).

Display 14 may have an array of pixels that form an active area AA that displays images for a user of device 10. For example, active area AA may include an array of display pixels. The array of pixels may be formed from liquid crystal display (LCD) components, an array of electrophoretic pixels, an array of plasma display pixels, an array of organic light-emitting diode display pixels or other light-emitting diode pixels, an array of electrowetting display pixels, or display pixels based on other display technologies. If desired, active area AA may include touch sensors such as touch sensor capacitive electrodes, force sensors, or other sensors for gathering a user input.

Display 14 may have an inactive border region that runs along one or more of the edges of active area AA. Inactive area IA of display 14 may be free of pixels for displaying images and may overlap circuitry and other internal device structures in housing 12. To block these structures from view by a user of device 10, the underside of the display cover layer or other layers in display 14 that overlap inactive area IA may be coated with an opaque masking layer in inactive area IA. The opaque masking layer may have any suitable color. Inactive area IA may include a recessed region such as notch 24 that extends into active area AA. Active area AA may, for example, be defined by the lateral area of a display module for display 14 (e.g., a display module that includes pixel circuitry, touch sensor circuitry, etc.). The display module may have a recess or notch in upper region 20 of device 10 that is free from active display circuitry (i.e., that forms notch 24 of inactive area IA). Notch 24 may be a substantially rectangular region that is surrounded (defined) on three sides by active area AA and on a fourth side by peripheral conductive housing structures 12W. One or more sensors may be aligned with notch 24 and may transmit and/or receive light through display 14 within notch 24.

Display 14 may be protected using a display cover layer such as a layer of transparent glass, clear plastic, transparent ceramic, sapphire, or other transparent crystalline material, or other transparent layer(s). The display cover layer may have a planar shape, a convex curved profile, a shape with planar and curved portions, a layout that includes a planar main area surrounded on one or more edges with a portion that is bent out of the plane of the planar main area, or other suitable shapes. The display cover layer may cover the entire front face of device 10. In another suitable arrangement, the display cover layer may cover substantially all of the front face of device 10 or only a portion of the front face of device 10. Openings may be formed in the display cover layer. For example, an opening may be formed in the display cover layer to accommodate a button. An opening may also be formed in the display cover layer to accommodate ports such as speaker port 16 in notch 24 or a microphone port. Openings may be formed in housing 12 to form communications ports (e.g., an audio jack port, a digital data port, etc.) and/or audio ports for audio components such as a speaker and/or a microphone if desired.

Display 14 may include conductive structures such as an array of capacitive electrodes for a touch sensor, conductive lines for addressing pixels, driver circuits, etc. Housing 12 may include internal conductive structures such as metal frame members and a planar conductive housing member (sometimes referred to as a conductive support plate or backplate) that spans the walls of housing 12 (e.g., a substantially rectangular sheet formed from one or more metal parts that is welded or otherwise connected between opposing sides of peripheral conductive housing structures 12W). The conductive support plate may form an exterior rear surface of device 10 or may be covered by a dielectric cover layer such as a thin cosmetic layer, protective coating, and/or other coatings that may include dielectric materials such as glass, ceramic, plastic, or other structures that form the exterior surfaces of device 10 and/or serve to hide the conductive support plate from view of the user (e.g., the conductive support plate may form part of rear housing wall 12R). Device 10 may also include conductive structures such as printed circuit boards, components mounted on printed circuit boards, and other internal conductive structures. These conductive structures, which may be used in forming a ground plane in device 10, may extend under active area AA of display 14, for example.

In regions 22 and 20, openings may be formed within the conductive structures of device 10 (e.g., between peripheral conductive housing structures 12W and opposing conductive ground structures such as conductive portions of rear housing wall 12R, conductive traces on a printed circuit board, conductive electrical components in display 14, etc.). These openings, which may sometimes be referred to as gaps, may be filled with air, plastic, and/or other dielectrics and may be used in forming slot antenna resonating elements for one or more antennas in device 10, if desired.

Conductive housing structures and other conductive structures in device 10 may serve as a ground plane for the antennas in device 10. The openings in regions 22 and 20 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, may contribute to the performance of a parasitic antenna resonating element, or may otherwise serve as part of antenna structures formed in regions 22 and 20. If desired, the ground plane that is under active area AA of display 14 and/or other metal structures in device 10 may have portions that extend into parts of the ends of device 10 (e.g., the ground may extend towards the dielectric-filled openings in regions 22 and 20), thereby narrowing the slots in regions 22 and 20. Region 22 may sometimes be referred to herein as lower region 22 or lower end 22 of device 10. Region 20 may sometimes be referred to herein as upper region 20 or upper end 20 of device 10.

In general, device 10 may include any suitable number of antennas (e.g., one or more, two or more, three or more, four or more, etc.). The antennas in device 10 may be located at opposing first and second ends of an elongated device housing (e.g., at lower region 22 and/or upper region 20 of device 10 of FIG. 1), along one or more edges of a device housing, in the center of a device housing, in other suitable locations, or in one or more of these locations. The arrangement of FIG. 1 is merely illustrative.

Portions of peripheral conductive housing structures 12W may be provided with peripheral gap structures. For example, peripheral conductive housing structures 12W may be provided with one or more dielectric-filled gaps such as gaps 18, as shown in FIG. 1. The gaps in peripheral conductive housing structures 12W may be filled with dielectric such as polymer, ceramic, glass, air, other dielectric materials, or combinations of these materials. Gaps 18 may divide peripheral conductive housing structures 12W into one or more peripheral conductive segments. The conductive segments that are formed in this way may form parts of antennas in device 10 if desired. Other dielectric openings may be formed in peripheral conductive housing structures 12W (e.g., dielectric openings other than gaps 18) and may serve as dielectric antenna windows for antennas mounted within the interior of device 10. Antennas within device 10 may be aligned with the dielectric antenna windows for conveying radio-frequency signals through peripheral conductive housing structures 12W. Antennas within device 10 may also be aligned with inactive area IA of display 14 for conveying radio-frequency signals through display 14.

To provide an end user of device 10 with as large of a display as possible (e.g., to maximize an area of the device used for displaying media, running applications, etc.), it may be desirable to increase the amount of area at the front face of device 10 that is covered by active area AA of display 14. Increasing the size of active area AA may reduce the size of inactive area IA within device 10. This may reduce the area behind display 14 that is available for antennas within device 10. For example, active area AA of display 14 may include conductive structures that serve to block radio-frequency signals handled by antennas mounted behind active area AA from radiating through the front face of device 10. It would therefore be desirable to be able to provide antennas that occupy a small amount of space within device 10 (e.g., to allow for as large of a display active area AA as possible) while still allowing the antennas to communicate with wireless equipment external to device 10 with satisfactory efficiency bandwidth.

In a typical scenario, device 10 may have one or more upper antennas and one or more lower antennas. An upper antenna may, for example, be formed in upper region 20 of device 10. A lower antenna may, for example, be formed in lower region 22 of device 10. Additional antennas may be formed along the edges of housing 12 extending between regions 20 and 22 if desired. The antennas may be used separately to cover identical communications bands, overlapping communications bands, or separate communications bands. The antennas may be used to implement an antenna diversity scheme or a multiple-input-multiple-output (MIMO) antenna scheme. Other antennas for covering any other desired frequencies may also be mounted at any desired locations within the interior of device 10. The example of FIG. 1 is merely illustrative. If desired, housing 12 may have other shapes (e.g., a square shape, cylindrical shape, spherical shape, combinations of these and/or different shapes, etc.).

Figure 2:
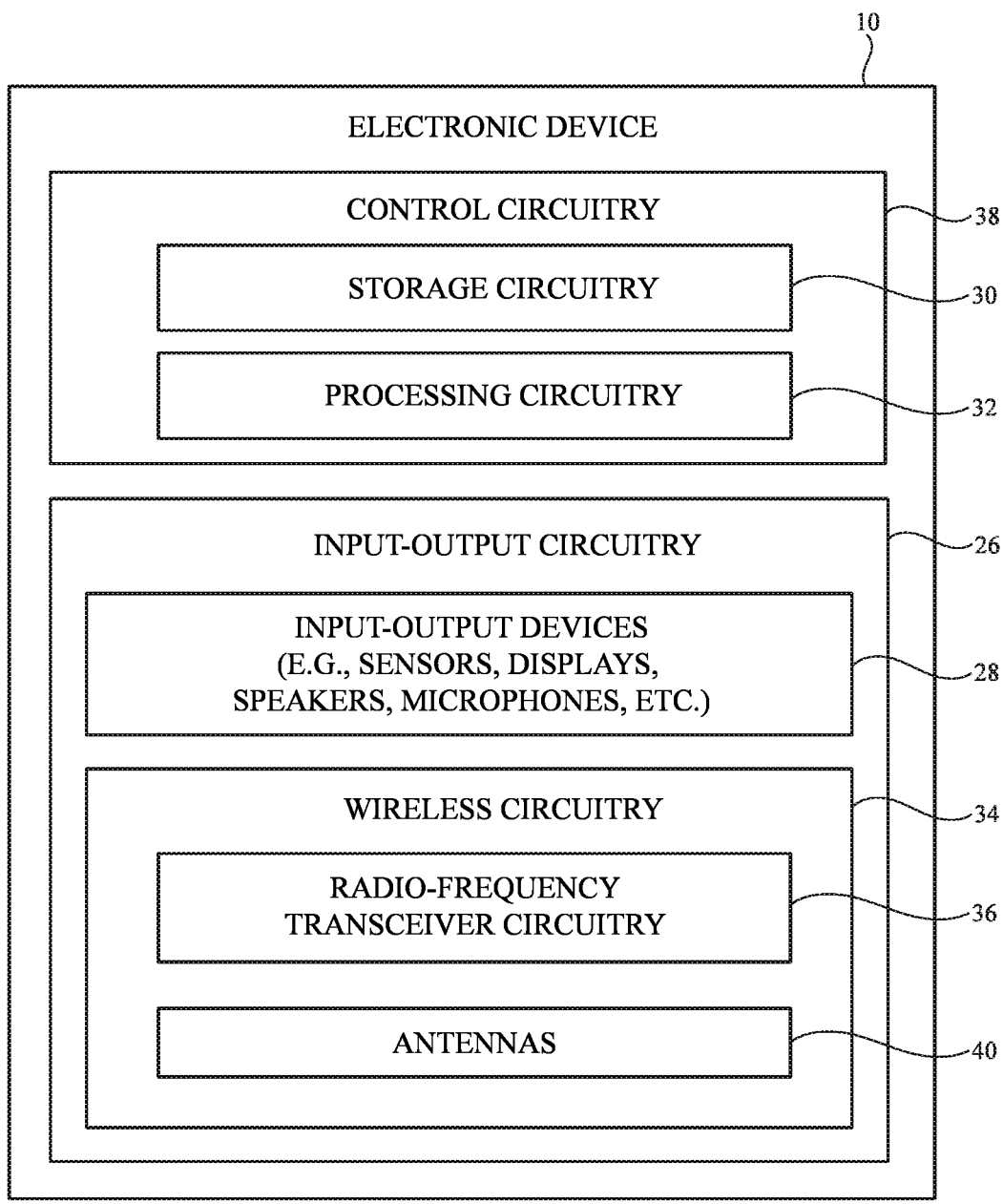
FIG. 2 is a schematic diagram of illustrative circuitry in an electronic device in accordance with some embodiments.

A schematic diagram of illustrative components that may be used in device 10 is shown in FIG. 2. As shown in FIG. 2, device 10 may include control circuitry 38. Control circuitry 38 may include storage such as storage circuitry 30. Storage circuitry 30 may include hard disk drive storage, nonvolatile memory (e.g., flash memory or other electrically-programmable-read-only memory configured to form a solid-state drive), volatile memory (e.g., static or dynamic random-access-memory), etc.

Control circuitry 38 may include processing circuitry such as processing circuitry 32. Processing circuitry 32 may be used to control the operation of device 10. Processing circuitry 32 may include one or more processors such as microprocessors, microcontrollers, digital signal processors, host processors, baseband processor integrated circuits, application specific integrated circuits, graphics processing units, central processing units (CPUs), etc. Control circuitry 38 may be configured to perform operations in device 10 using hardware (e.g., dedicated hardware or circuitry), firmware, and/or software. Software code for performing operations in device 10 may be stored on storage circuitry 30 (e.g., storage circuitry 30 may include non-transitory (tangible) computer readable storage media that stores the software code). The software code may sometimes be referred to as program instructions, software, data, instructions, or code. Software code stored on storage circuitry 30 may be executed by processing circuitry 32.

Control circuitry 38 may be used to run software on device 10 such as internet browsing applications, voice-over-internet-protocol (VOIP) telephone call applications, email applications, media playback applications, operating system functions, etc. To support interactions with external equipment, control circuitry 38 may be used in implementing communications protocols. Communications protocols that may be implemented using control circuitry 38 include internet protocols, wireless local area network protocols (e.g., IEEE 802.11 protocols—sometimes referred to as WiFi®), protocols for other short-range wireless communications links such as the Bluetooth® protocol or other WPAN protocols, IEEE 802.11ad protocols, cellular telephone protocols, MIMO protocols, antenna diversity protocols, satellite navigation system protocols, antenna-based spatial ranging protocols (e.g., radio detection and ranging (RADAR) protocols or other desired range detection protocols for signals conveyed at millimeter and centimeter wave frequencies), etc. Each communication protocol may be associated with a corresponding radio access technology (RAT) that specifies the physical connection methodology used in implementing the protocol.

Device 10 may include input-output circuitry 26. Input-output circuitry 26 may include input-output devices 28. Input-output devices 28 may be used to allow data to be supplied to device 10 and to allow data to be provided from device 10 to external devices. Input-output devices 28 may include user interface devices, data port devices, sensors, and other input-output components. For example, input-output devices 28 may include touch screens, displays without touch sensor capabilities, buttons, joysticks, scrolling wheels, touch pads, key pads, keyboards, microphones, cameras, speakers, status indicators, light sources, audio jacks and other audio port components, digital data port devices, light sensors, gyroscopes, accelerometers or other components that can detect motion and device orientation relative to the Earth, capacitance sensors, proximity sensors (e.g., a capacitive proximity sensor and/or an infrared proximity sensor), magnetic sensors, and other sensors and input-output components. The sensors in input-output devices 28 may include front-facing sensors that gather sensor data through display 14. The front-facing sensors may be optical sensors. The optical sensors may include an image sensor (e.g., a front-facing camera), an infrared sensor, and/or an ambient light sensor. The infrared sensor may include one or more infrared emitters (e.g., a dot projector and a flood illuminator) and/or one or more infrared image sensors.

Input-output circuitry 26 may include wireless circuitry such as wireless circuitry 34 for wirelessly conveying radio-frequency signals. While control circuitry 38 is shown separately from wireless circuitry 34 in the example of FIG. 2 for the sake of clarity, wireless circuitry 34 may include processing circuitry that forms a part of processing circuitry 32 and/or storage circuitry that forms a part of storage circuitry 30 of control circuitry 38 (e.g., portions of control circuitry 38 may be implemented on wireless circuitry 34). As an example, control circuitry 38 may include baseband processor circuitry or other control components that form a part of wireless circuitry 34.

Wireless circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless circuitry 34 may include radio-frequency transceiver circuitry 36 for handling transmission and/or reception of radio-frequency signals within corresponding frequency bands at radio frequencies (sometimes referred to herein as communications bands or simply as "bands"). The frequency bands handled by radio-frequency transceiver circuitry 36 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone communications bands such as a cellular low band (LB) (e.g., 600 to 960 MHz), a cellular low-midband (LMB) (e.g., 1400 to 1550 MHz), a cellular midband (MB) (e.g., from 1700 to 2200 MHz), a cellular high band (HB) (e.g., from 2300 to 2700 MHz), a cellular ultra-high band (UHB) (e.g., from 3300 to 5000 MHz, or other cellular communications bands between about 600 MHz and about 5000 MHz), 3G bands, 4G LTE bands, 3GPP 5G New Radio Frequency Range 1 (FR1) bands below 10 GHz, 3GPP 5G New Radio (NR) Frequency Range 2 (FR2) bands between 20 and 60 GHz, other centimeter or millimeter wave frequency bands between 10-300 GHz, near-field communications frequency bands (e.g., at 13.56 MHz), satellite navigation frequency bands such as the Global Positioning System (GPS) L1 band (e.g., at 1575 MHz), L2 band (e.g., at 1228 MHz), L3 band (e.g., at 1381 MHz), L4 band (e.g., at 1380 MHz), and/or L5 band (e.g., at 1176 MHz), a Global Navigation Satellite System (GLONASS) band, a BeiDou Navigation Satellite System (BDS) band, ultra-wideband (UWB) frequency bands that operate under the IEEE 802.15.4 protocol and/or other ultra-wideband communications protocols (e.g., a first UWB communications band at 6.5 GHz and/or a second UWB communications band at 8.0 GHz), communications bands under the family of 3GPP wireless communications standards, communications bands under the IEEE 802.XX family of standards, satellite communications bands such as an L-band, S-band (e.g., from 2-4 GHz), C-band (e.g., from 4-8 GHz), X-band, Ku-band (e.g., from 12-18 GHz), Ka-band (e.g., from 26-40 GHz), etc., industrial, scientific, and medical (ISM) bands such as an ISM band between around 900 MHz and 950 MHz or other ISM bands below or above 1 GHz, one or more unlicensed bands, one or more bands reserved for emergency and/or public services, and/or any other desired frequency bands of interest. Wireless circuitry 34 may also be used to perform spatial ranging operations if desired.

The UWB communications handled by radio-frequency transceiver circuitry 36 may be based on an impulse radio signaling scheme that uses band-limited data pulses. Radio-frequency signals in the UWB frequency band may have any desired bandwidths such as bandwidths between 499 MHz and 1331 MHz, bandwidths greater than 500 MHz, etc. The presence of lower frequencies in the baseband may sometimes allow ultra-wideband signals to penetrate through objects such as walls. In an IEEE 802.15.4 system, for example, a pair of electronic devices may exchange wireless time stamped messages. Time stamps in the messages may be analyzed to determine the time of flight of the messages and thereby determine the distance (range) between the devices and/or an angle between the devices (e.g., an angle of arrival of incoming radio-frequency signals).

Radio-frequency transceiver circuitry 36 may include respective transceivers (e.g., transceiver integrated circuits or chips) that handle each of these frequency bands or any desired number of transceivers that handle two or more of these frequency bands. In scenarios where different transceivers are coupled to the same antenna, filter circuitry (e.g., duplexer circuitry, diplexer circuitry, low pass filter circuitry, high pass filter circuitry, band pass filter circuitry, band stop filter circuitry, etc.), switching circuitry, multiplexing circuitry, or any other desired circuitry may be used to isolate radio-frequency signals conveyed by each transceiver over the same antenna (e.g., filtering circuitry or multiplexing circuitry may be interposed on a radio-frequency transmission line shared by the transceivers). Radio-frequency transceiver circuitry 36 may include one or more integrated circuits (chips), integrated circuit packages (e.g., multiple integrated circuits mounted on a common printed circuit in a system-in-package device, one or more integrated circuits mounted on different substrates, etc.), power amplifier circuitry, up-conversion circuitry, down-conversion circuitry, low-noise input amplifiers, passive radio-frequency components, switching circuitry, transmission line structures, and other circuitry for handling radio-frequency signals and/or for converting signals between radio-frequencies, intermediate frequencies, and/or baseband frequencies.

In general, radio-frequency transceiver circuitry 36 may cover (handle) any desired frequency bands of interest. As shown in FIG. 2, wireless circuitry 34 may include antennas 40. Radio-frequency transceiver circuitry 36 may convey radio-frequency signals using one or more antennas 40 (e.g., antennas 40 may convey the radio-frequency signals for the transceiver circuitry). The term "convey radio-frequency signals" as used herein means the transmission and/or reception of the radio-frequency signals (e.g., for performing unidirectional and/or bidirectional wireless communications with external wireless communications equipment). Antennas 40 may transmit the radio-frequency signals by radiating the radio-frequency signals into free space (or to freespace through intervening device structures such as a dielectric cover layer). Antennas 40 may additionally or alternatively receive the radio-frequency signals from free space (e.g., through intervening devices structures such as a dielectric cover layer). The transmission and reception of radio-frequency signals by antennas 40 each involve the excitation or resonance of antenna currents on an antenna resonating element in the antenna by the radio-frequency signals within the frequency band(s) of operation of the antenna.

Antennas 40 in wireless circuitry 34 may be formed using any suitable antenna structures. For example, antennas 40 may include antennas with resonating elements that are formed from stacked patch antenna structures, loop antenna structures, patch antenna structures, inverted-F antenna structures, slot antenna structures, planar inverted-F antenna structures, waveguide structures, monopole antenna structures, dipole antenna structures, helical antenna structures, Yagi (Yagi-Uda) antenna structures, hybrids of these designs, etc. If desired, antennas 40 may include antennas with dielectric resonating elements such as dielectric resonator antennas. If desired, one or more of antennas 40 may be cavity-backed antennas. Two or more antennas 40 may be arranged in a phased antenna array if desired (e.g., for conveying centimeter and/or millimeter wave signals within a signal beam formed in a desired beam pointing direction that may be steered/adjusted over time). Different types of antennas may be used for different bands and combinations of bands.

Figure 3:
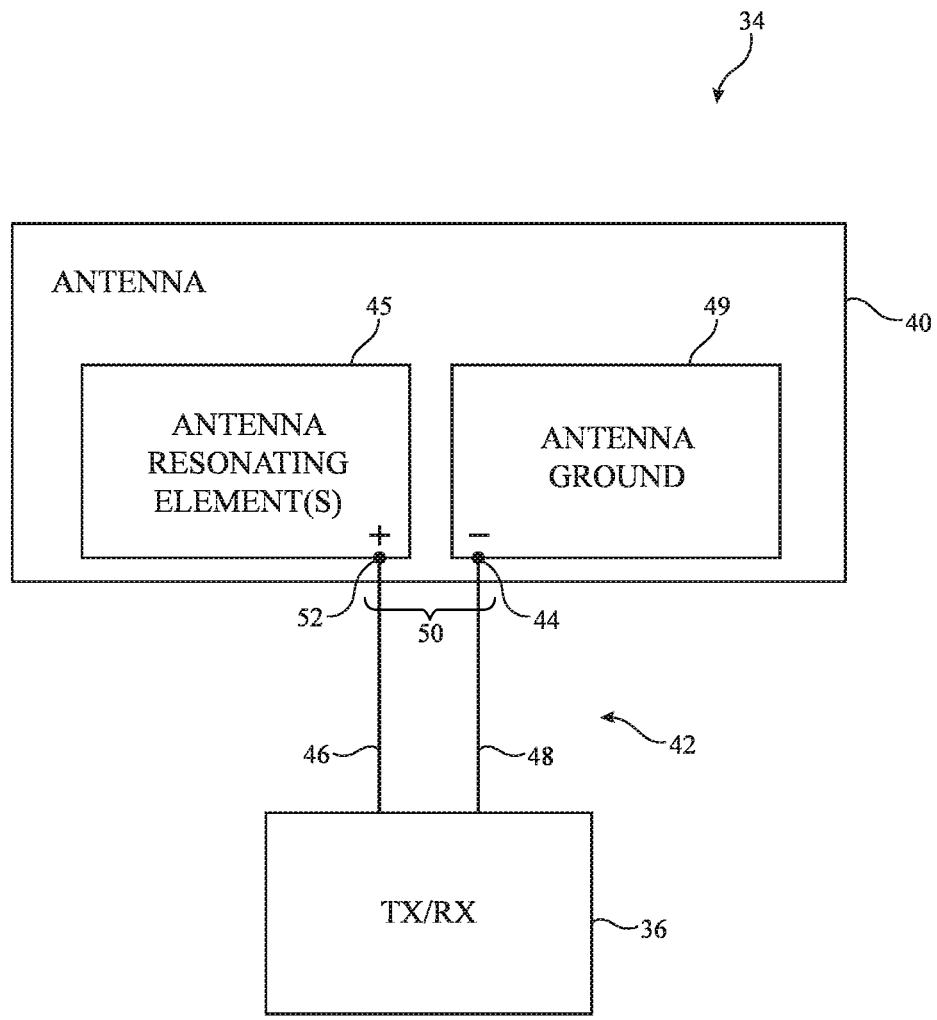
FIG. 3 is a schematic diagram of illustrative wireless circuitry in accordance with some embodiments.

FIG. 3 is a schematic diagram showing how a given antenna 40 may be fed by radio-frequency transceiver circuitry 36. As shown in FIG. 3, antenna 40 may have a corresponding antenna feed 50. Antenna 40 may include one or more antenna resonating (radiating) elements 45 and an antenna ground 49. Antenna resonating element(s) 45 may include one or more radiating arms, slots, waveguides, dielectric resonators, patches, parasitic elements, indirect feed elements, and/or any other desired antenna radiators. Antenna feed 50 may include a positive antenna feed terminal 52 coupled to antenna resonating element 45 and a ground antenna feed terminal 44 coupled to antenna ground 49.

Radio-frequency transceiver (TX/RX) circuitry 36 may be coupled to antenna feed 50 using a radio-frequency transmission line path 42 (sometimes referred to herein as transmission line path 42). Transmission line path 42 may include a signal conductor such as signal conductor 46 (e.g., a positive signal conductor). Transmission line path 42 may include a ground conductor such as ground conductor 48. Ground conductor 48 may be coupled to ground antenna feed terminal 44 of antenna feed 50. Signal conductor 46 may be coupled to positive antenna feed terminal 52 of antenna feed 50.

Transmission line path 42 may include one or more radio-frequency transmission lines. The radio-frequency transmission line(s) in transmission line path 42 may include stripline transmission lines (sometimes referred to herein simply as striplines), coaxial cables, coaxial probes realized by metalized vias, microstrip transmission lines, edge-coupled microstrip transmission lines, edge-coupled stripline transmission lines, waveguide structures, combinations of these, etc. Multiple types of radio-frequency transmission line may be used to form transmission line path 42. Filter circuitry, switching circuitry, impedance matching circuitry, phase shifter circuitry, amplifier circuitry, and/or other circuitry may be interposed on transmission line path 42, if desired. One or more antenna tuning components for adjusting the frequency response of antenna 40 in one or more bands may be interposed on transmission line path 42 and/or may be integrated within antenna 40 (e.g., coupled between the antenna ground and the antenna resonating element of antenna 40, coupled between different portions of the antenna resonating element of antenna 40, etc.).

If desired, one or more of the radio-frequency transmission lines in transmission line path 42 may be integrated into ceramic substrates, rigid printed circuit boards, and/or flexible printed circuits. In one suitable arrangement, the radio-frequency transmission lines may be integrated within multilayer laminated structures (e.g., layers of a conductive material such as copper and a dielectric material such as a resin that are laminated together without intervening adhesive) that may be folded or bent in multiple dimensions (e.g., two or three dimensions) and that maintain a bent or folded shape after bending (e.g., the multilayer laminated structures may be folded into a particular three-dimensional shape to route around other device components and may be rigid enough to hold its shape after folding without being held in place by stiffeners or other structures). All the multiple layers of the laminated structures may be batch laminated together (e.g., in a single pressing process) without adhesive (e.g., as opposed to performing multiple pressing processes to laminate multiple layers together with adhesive).

Figure 4:
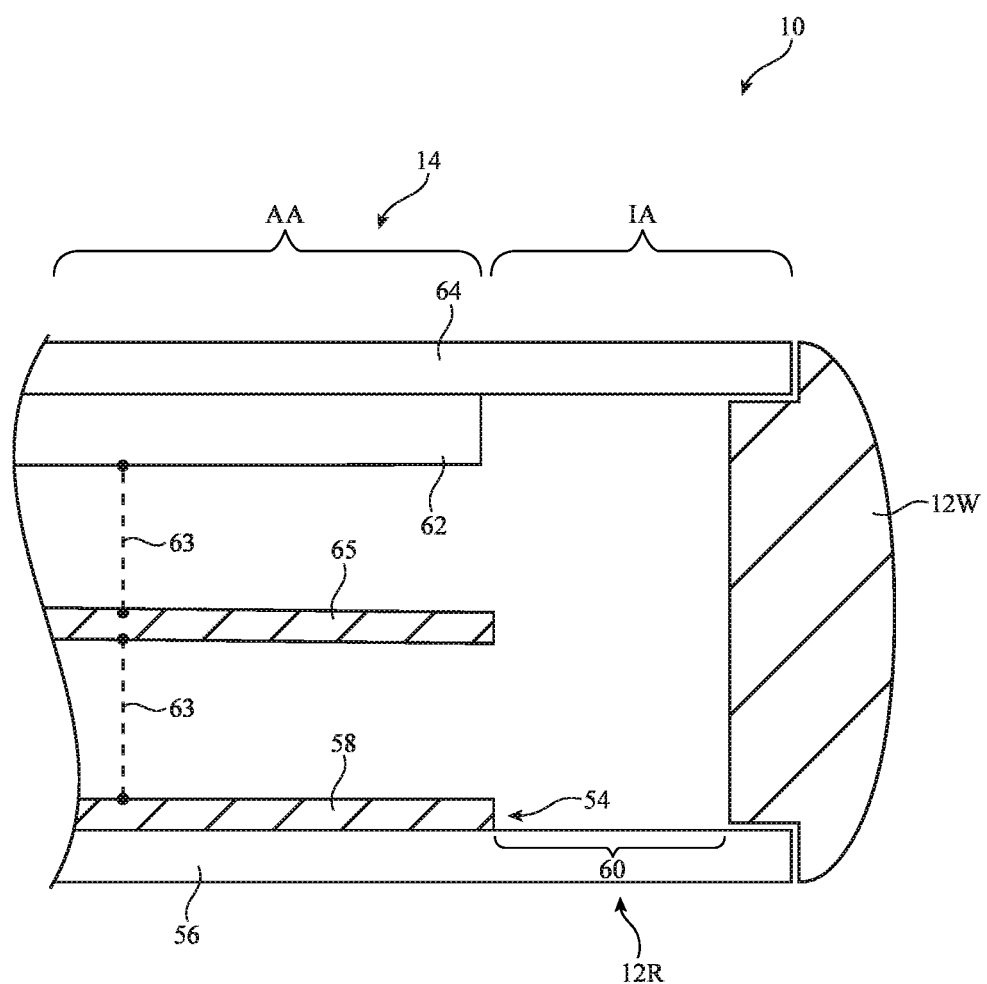
FIG. 4 is a cross-sectional side view of an electronic device having housing structures that may be used in forming antenna structures in accordance with some embodiments.

If desired, conductive electronic device structures such as conductive portions of housing 12 (FIG. 1) may be used to form at least part of one or more of the antennas 40 in device 10. FIG. 4 is a cross-sectional side view of device 10, showing illustrative conductive electronic device structures that may be used in forming one or more of the antennas 40 in device 10.

As shown in FIG. 4, peripheral conductive housing structures 12W may extend around the lateral periphery of device 10 (e.g., as measured in the X-Y plane of FIG. 1). Peripheral conductive housing structures 12W may extend from rear housing wall 12R (e.g., at the rear face of device 10) to display 14 (e.g., at the front face of device 10). In other words, peripheral conductive housing structures 12W may form conductive sidewalls for device 10, a first of which is shown in the cross-sectional side view of FIG. 4 (e.g., a given sidewall that runs along an edge of device 10 and that extends across the width or length of device 10).

Display 14 may have a display module such as display module 62 (sometimes referred to as a display panel). Display module 62 may include pixel circuitry, touch sensor circuitry, force sensor circuitry, and/or any other desired circuitry for forming active area AA of display 14. Display 14 may include a dielectric cover layer such as display cover layer 64 that overlaps display module 62. Display cover layer 64 may include plastic, glass, sapphire, ceramic, and/or any other desired dielectric materials. Display module 62 may emit image light and may receive sensor input (e.g., touch and/or force sensor input) through display cover layer 64. Display cover layer 64 and display 14 may be mounted to peripheral conductive housing structures 12W. The lateral area of display 14 that does not overlap display module 62 may form inactive area IA of display 14.

As shown in FIG. 4, rear housing wall 12R may be mounted to peripheral conductive housing structures 12W (e.g., opposite display 14). Rear housing wall 12R may include a conductive layer such as conductive support plate 58. Conductive support plate 58 may extend across an entirety of the width of device 10 (e.g., between the left and right edges of device 10 as shown in FIG. 1). Conductive support plate 58 may be formed from an integral portion of peripheral conductive housing structures 12W that extends across the width of device 10 or may include a separate housing structure attached, coupled, or affixed to peripheral conductive housing structures 12W.

If desired, rear housing wall 12R may include a dielectric cover layer such as dielectric cover layer 56. Dielectric cover layer 56 may include glass, plastic, sapphire, ceramic, one or more dielectric coatings, or other dielectric materials. Dielectric cover layer 56 may be layered under conductive support plate 58 (e.g., conductive support plate 58 may be coupled to an interior surface of dielectric cover layer 56). If desired, dielectric cover layer 56 may extend across an entirety of the width of device 10 and/or an entirety of the length of device 10. Dielectric cover layer 56 may overlap slot 60. If desired, dielectric cover layer 56 be provided with pigmentation and/or an opaque masking layer (e.g., an ink layer) that helps to hide the interior of device 10 from view. In another suitable arrangement, dielectric cover layer 56 may be omitted and slot 60 may be filled with a solid dielectric material.

The housing for device 10 may also include one or more additional conductive support plates interposed between display 14 and rear housing wall 12R. For example, the housing for device 10 may include a conductive support plate such as mid-chassis 65 (sometimes referred to herein as conductive support plate 65). Mid-chassis 65 may be vertically interposed between rear housing wall 12R and display 14 (e.g., conductive support plate 58 may be located at a first distance from display 14 whereas mid-chassis 65 is located at a second distance that is less than the first distance from display 14). Mid-chassis 65 may extend across an entirety of the width of device 10 (e.g., between the left and right edges of device 10 as shown in FIG. 1). Mid-chassis 65 may be formed from an integral portion of peripheral conductive housing structures 12W that extends across the width of device 10 or may include a separate housing structure attached, coupled, or affixed to peripheral conductive housing structures 12W. One or more components may be supported by mid-chassis 65 (e.g., logic boards such as a main logic board, a battery, etc.) and/or mid-chassis 65 may contribute to the mechanical strength of device 10. Mid-chassis 65 may be formed from metal (e.g., stainless steel, aluminum, etc.).

Conductive support plate 58, mid-chassis 65, and/or display module 62 may have an edge 54 that is separated from peripheral conductive housing structures 12W by dielectric-filled slot 60 (sometimes referred to herein as opening 60, gap 60, or aperture 60). Slot 60 may be filled with air, plastic, ceramic, or other dielectric materials. Conductive housing structures such as conductive support plate 58, mid-chassis 65, conductive portions of display module 62, and/or peripheral conductive housing structures 12W (e.g., the portion of peripheral conductive housing structures 12W opposite conductive support plate 58, mid-chassis 65, and display module 62 at slot 60) may be used to form antenna structures for one or more of the antennas 40 in device 10.

For example, peripheral conductive housing structures 12W may form an antenna resonating element arm (e.g., an inverted-F antenna resonating element arm) in the antenna resonating element 45 of an antenna 40 in device 10. Mid-chassis 65, conductive support plate 58, and/or display module 62 may be used to form the antenna ground 49 (FIG. 3) for one or more of the antennas 40 in device 10 and/or to form one or more edges of slot antenna resonating elements for the antennas in device 10. One or more conductive interconnect structures 63 may electrically couple mid-chassis 65 to conductive support plate 58 and/or one or more conductive interconnect structures 63 may electrically couple mid-chassis 65 to conductive structures in display module 62 (sometimes referred to herein as conductive display structures) so that each of these elements form part of the antenna ground. The conductive display structures may include a conductive frame, bracket, or support for display module 62, shielding layers in display module 62, ground traces in display module 62, etc.

Conductive interconnect structures 63 may serve to ground mid-chassis 65 to conductive support plate 58 and/or display module 62 (e.g., to ground conductive support plate 58 to the conductive display structures through mid-chassis 65). Put differently, conductive interconnect structures 63 may hold the conductive display structures, mid-chassis 65, and/or conductive support plate 58 to a common ground or reference potential (e.g., as a system ground for device 10 that is used to form part of antenna ground 49 of FIG. 3). Conductive interconnect structures 63 may therefore sometimes be referred to herein as grounding structures 63, grounding interconnect structures 63, or vertical grounding structures 63. Conductive interconnect structures 63 may include conductive traces, conductive pins, conductive springs, conductive prongs, conductive brackets, conductive screws, conductive clips, conductive tape, conductive wires, conductive traces, conductive foam, conductive adhesive, solder, welds, metal members (e.g., sheet metal members), contact pads, conductive vias, conductive portions of one or more components mounted to mid-chassis 65 and/or conductive support plate 58, and/or any other desired conductive interconnect structures.

Figure 5:
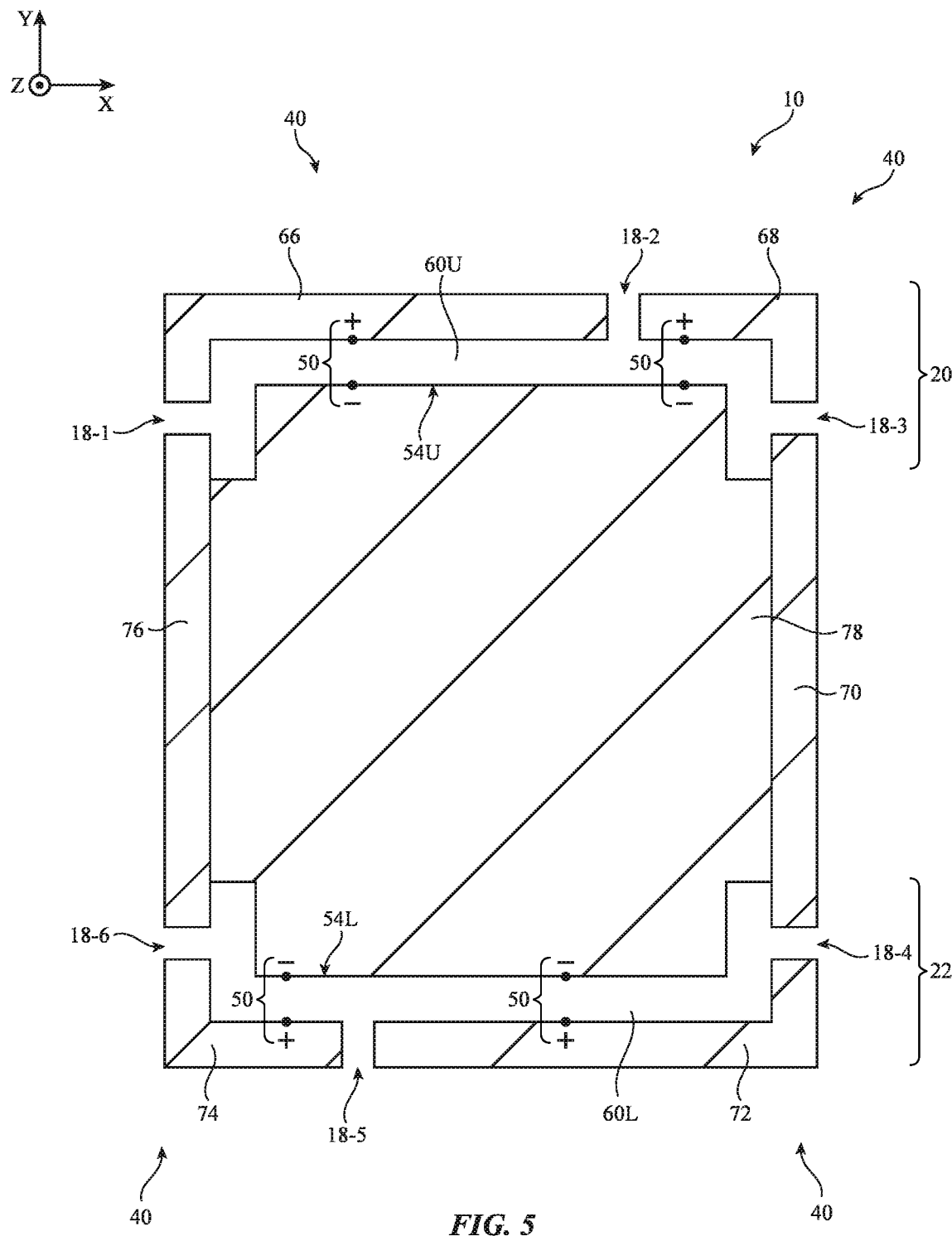
FIG. 5 is a top interior view of an illustrative electronic device having peripheral conductive housing structures that are segmented to form antenna resonating elements for one or more antennas in accordance with some embodiments.

If desired, device 10 may include multiple slots 60 and peripheral conductive housing structures 12W may include multiple dielectric gaps that divide the peripheral conductive housing structures into segments (e.g., dielectric gaps 18 of FIG. 1). FIG. 5 is a top interior view showing how device 10 may include multiple slots 60 and may include multiple dielectric gaps that divide the peripheral conductive housing structures into segments. Display 14 and other internal components have been removed from the view shown in FIG. 5 for the sake of clarity.

As shown in FIG. 5, peripheral conductive housing structures 12W may include a first conductive sidewall at the left edge of device 10, a second conductive sidewall at the top edge of device 10, a third conductive sidewall at the right edge of device 10, and a fourth conductive sidewall at the bottom edge of device 10 (e.g., in an example where device 10 has a substantially rectangular lateral shape). Peripheral conductive housing structures 12W may be segmented by dielectric-filled gaps 18 such as a first gap 18-1, a second gap 18-2, a third gap 18-3, a fourth gap 18-4, a fifth gap 18-5, and a sixth gap 18-6. Gaps 18-1, 18-2, 18-3, 18-4, 18-5, and 18-6 may be filled with plastic, ceramic, sapphire, glass, epoxy, or other dielectric materials. The dielectric material in the gaps may lie flush with peripheral conductive housing structures 12W at the exterior surface of device 10 if desired.

Gap 18-1 may divide the first conductive sidewall to separate segment 76 of peripheral conductive housing structures 12W from segment 66 of peripheral conductive housing structures 12W. Gap 18-2 may divide the second conductive sidewall to separate segment 66 from segment 68 of peripheral conductive housing structures 12W. Gap 18-3 may divide the third conductive sidewall to separate segment 68 from segment 70 of peripheral conductive housing structures 12W. Gap 18-4 may divide the third conductive sidewall to separate segment 70 from segment 72 of peripheral conductive housing structures 12W. Gap 18-5 may divide the fourth conductive sidewall to separate segment 72 from segment 74 of peripheral conductive housing structures 12W. Gap 18-6 may divide the first conductive sidewall to separate segment 74 from segment 76.

In this example, segment 66 forms the top-left corner of device 10 (e.g., segment 66 may have a bend at the corner) and is formed from the first and second conductive sidewalls of peripheral conductive housing structures 12W (e.g., in upper region 20 of device 10). Segment 68 forms the top-right corner of device 10 (e.g., segment 68 may have a bend at the corner) and is formed from the second and third conductive sidewalls of peripheral conductive housing structures 12W (e.g., in upper region 20 of device 10). Segment 72 forms the bottom-right corner of device 10 and is formed from the third and fourth conductive sidewalls of peripheral conductive housing structures 12W (e.g., in lower region 22 of device 10). Segment 74 forms the bottom-left corner of device 10 and is formed from the fourth and first conductive sidewalls of peripheral conductive housing structures 12W (e.g., in lower region 22 of device 10).

Device 10 may include ground structures 78 (e.g., structures that form part of antenna ground 49 of FIG. 3 for one or more of the antennas 40 in device 10). Ground structures 78 may include one or more metal layers such conductive support plate 58 (FIG. 4), mid-chassis 65 (FIG. 4), conductive display structures in display module 62 (FIG. 4), conductive interconnect structures 63 (FIG. 4), conductive traces on a printed circuit board, conductive portions of one or more components in device 10, etc. Ground structures 78 may extend between opposing sidewalls of peripheral conductive housing structures 12W. For example, ground structures 79 may extend from segment 70 to segment 76 of peripheral conductive housing structures 12W (e.g., across the width of device 10, parallel to the X-axis of FIG. 5). Ground structures 78 may be welded or otherwise affixed to segments 76 and 70. In another suitable arrangement, some or all of ground structures 78, segment 76, and segment 70 may be formed from a single, integral (continuous) piece of machined metal (e.g., in a unibody configuration).

As shown in FIG. 5, device 10 may include multiple slots 60 (FIG. 4). For example, device 10 may include an upper slot such as slot 60U in upper region 20 and a lower slot such as slot 60L in lower region 22. The lower edge of slot 60U may be defined by upper edge 54U of ground structures 78. The upper edge of slot 60U may be defined by segments 66 and 68 (e.g., slot 60U may be interposed between ground structures 78 and segments 66 and 68 of peripheral conductive housing structures 12W). The upper edge of slot 60L may be defined by lower edge 54L of ground structures 78. The lower edge of slot 60L may be defined by segments 74 and 72 (e.g., slot 60L may be interposed between ground structures 78 and segments 74 and 72 of peripheral conductive housing structures 12W).

Slot 60U may have an elongated shape extending from a first end at gap 18-2 to an opposing second end at gap 18-3 (e.g., slot 60U may span the width of device 10). Similarly, slot 60L may have an elongated shape extending from a first end at gap 18-6 to an opposing second end at gap 18-4 (e.g., slot 60L may span the width of device 10). Slots 60U and 60L may be filled with air, plastic, glass, sapphire, epoxy, ceramic, or other dielectric material. Slot 60U may be continuous with gaps 18-1, 18-2, and 18-3 in peripheral conductive housing structures 12W if desired (e.g., a single piece of dielectric material may be used to fill both slot 60U and gaps 18-1, 18-2, and 18-3). Similarly, slot 60L may be continuous with gaps 18-6, 18-5, and 18-4 if desired (e.g., a single piece of dielectric material may be used to fill both slot 60L and gaps 18-6, 18-5, and 18-4).

Ground structures 78, segment 66, segment 68, and portions of slot 60U may be used in forming multiple antennas 40 in upper region 20 of device 10 (sometimes referred to herein as upper antennas). Ground structures 78, portions of slot 60L, segment 74, and segment 72 may be used in forming multiple antennas 40 in lower region 22 of device 10 (sometimes referred to herein as lower antennas). Each antenna 40 may be fed by a respective antenna feed 50. For example, a first antenna 40 in the upper-left corner of device 10 may have an antenna resonating element (e.g., an antenna arm) formed from segment 66 and a corresponding antenna feed 50 coupled between segment 66 and ground structures 78 across slot 60U (e.g., where the positive antenna feed terminal of the antenna feed is coupled to segment 66 and the ground antenna feed terminal of the antenna feed is coupled to ground structures 78). A second antenna 40 in the upper-right corner of device 10 may have an antenna resonating element (e.g., an antenna arm) formed from segment 68 and a corresponding antenna feed 50 coupled across slot 60L between segment 68 and ground structures 78 (e.g., where the positive antenna feed terminal of the antenna feed is coupled to segment 68 and the ground antenna feed terminal of the antenna feed is coupled to ground structures 78). A third antenna 40 in the bottom-right corner of device 10 may have an antenna resonating element (e.g., an antenna arm) formed from segment 72 and a corresponding antenna feed 50 coupled between segment 72 and ground structures 78 (e.g., where the positive antenna feed terminal of the antenna feed is coupled to segment 72 and the ground antenna feed terminal of the antenna feed is coupled to ground structures 78). A fourth antenna 40 in the bottom-left corner of device 10 may have an antenna resonating element (e.g., an antenna arm) formed from segment 74 and a corresponding antenna feed 50 coupled between segment 74 and ground structures 78 (e.g., where the positive antenna feed terminal of the antenna feed is coupled to segment 74 and the ground antenna feed terminal of the antenna feed is coupled to ground structures 78).

Device 10 may include one or more components that overlap the volume of one or more antennas 40 in upper region 20 and/or lower region 22 of device 10. Such components may include, for example, a speaker. If care is not taken, the presence of the speaker or other components may make it difficult to ground the antenna feed 50 for one of antennas 40 at a location sufficiently close to the antenna so as to optimize wireless performance. To mitigate these issues, device 10 may include a conductive spring integrated into the speaker for grounding antenna 40.

Figure 6:
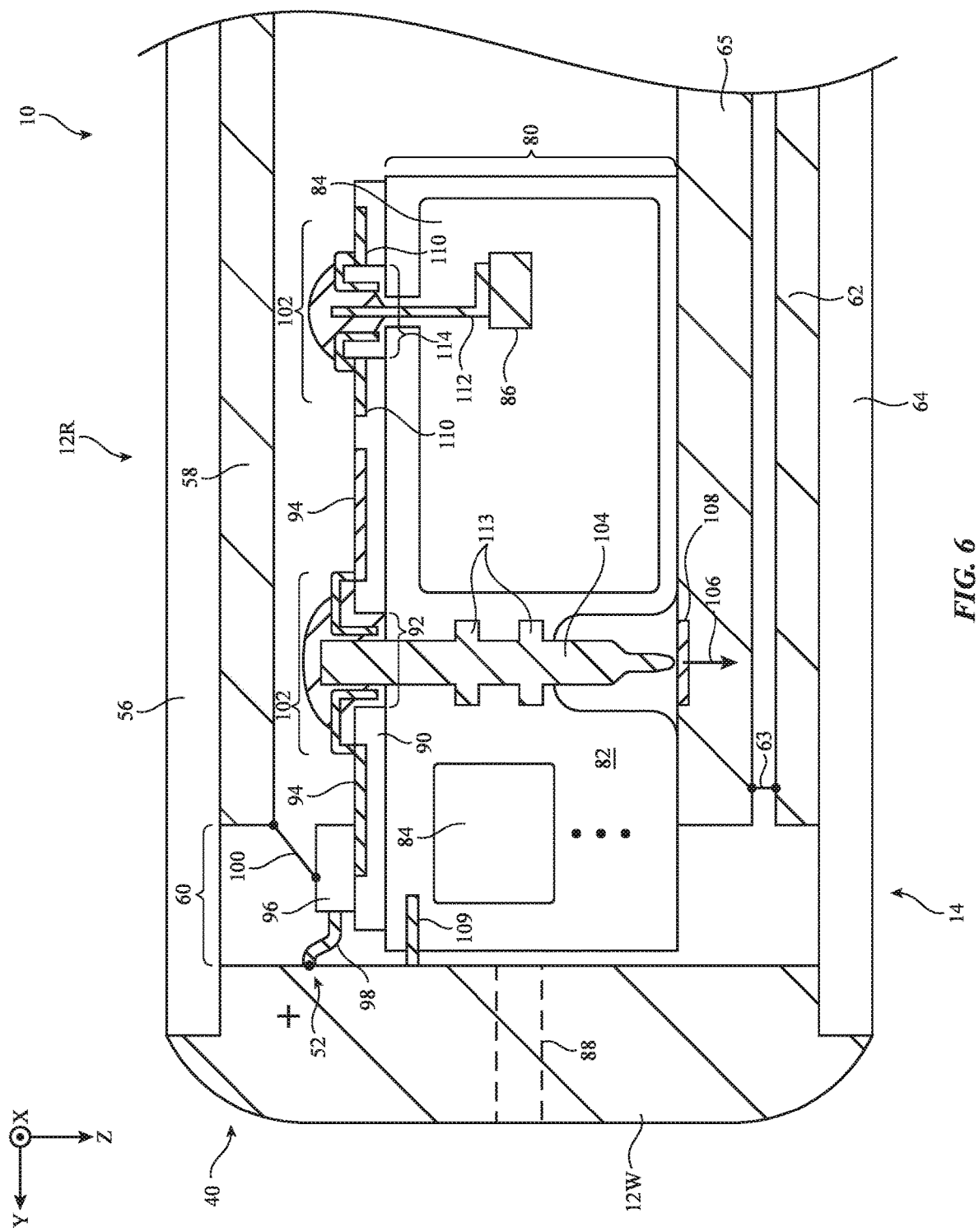
FIG. 6 is a cross-sectional side view showing how an illustrative antenna may be fed by a printed circuit having conductive traces that are soldered to conductive contacts extending into a speaker in accordance with some embodiments.

FIG. 6 is a bottom-up cross-sectional side view of device 10 showing how a conductive spring may be integrated into a speaker for grounding an adjacent antenna 40. As shown in FIG. 6, a speaker such as speaker 80 may be mounted within device 10 at or adjacent to a segment of peripheral conductive housing structures 12W. The segment of peripheral conductive housing structures 12W may form an antenna resonating element arm for a corresponding antenna 40 in device 10 (e.g., for any of the antennas 40 shown in FIG. 5). The segment of peripheral conductive housing structures 12W in FIG. 6 may, for example, include segments 66, 68, 72, or 74 of FIG. 5.

As shown in FIG. 6, speaker 80 may be disposed on or mounted to mid-chassis 65. At least some of speaker 80 may overlap slot 60 between peripheral conductive housing structures 12W and conductive support plate 58, mid-chassis 65, and display module 62. Speaker 80 may be mounted, secured, attached, affixed, or otherwise coupled to peripheral conductive housing structures 12W using mounting bracket 109. Speaker 80 may be vertically interposed between mid-chassis 65 and conductive support plate 58 in rear housing wall 12R. Speaker 80 may sometimes be referred to herein as (acoustic) receiver 80, speaker module 80, or speaker box 80.

Speaker 80 may include a speaker substrate such as substrate 82. Substrate 82 may include injection-molded plastic, as one example (e.g., an injection-molded plastic frame or housing for speaker 82). Speaker 80 may include one or more cavities 84 in substrate 82. A speaker driver such as speaker driver 86 may be disposed within one of the cavities 84 in substrate 82. Speaker driver 86 may be driven using audio signals to produce acoustic sound (e.g., sound waves). Speaker driver 86 may include, for example, a speaker coil and a diaphragm. Cavity 84 may amplify and/or resonate waves of the acoustic sound and/or may tune a frequency response of the acoustic sound. The sound may pass from speaker 80 to the exterior of device 10 to be heard by a user. The sound may pass through speaker port 16 in display 14 (FIG. 1) (e.g., when speaker 80 is mounted within upper region 20 of FIG. 5) and/or through one or more speaker holes 88 cut into peripheral conductive housing structures 12W (e.g., when speaker 80 is mounted within upper region 20 or lower region 22 of FIG. 5).

Antenna 40 of FIG. 6 may be fed by an antenna feed 50 (FIG. 5) having a positive antenna feed terminal 52 coupled to peripheral conductive housing structures 12W. A printed circuit such as printed circuit 90 may be disposed on, mounted to, or layered on speaker 80 (e.g., the side of speaker 80 opposite mid-chassis 65). Printed circuit 90 may include conductive traces that form a transmission line path 42 (FIG. 3) for antenna 40. Printed circuit 90 may include a rigid printed circuit board or a flexible printed circuit. Implementations in which printed circuit 90 is a flexible printed circuit are described herein as an example. Printed circuit 90 may therefore sometimes be referred to herein as antenna flex 90. The conductive traces on printed circuit 90 may also include conductive traces 110 (sometimes referred to herein as speaker traces). Conductive traces 110 may include control lines, power lines, and/or drive lines that carry audio signals, control signals, and/or other signals to speaker driver 86 in speaker 80.

Conductive traces 110 may be coupled to speaker driver 86 by conductive interconnect structures 102. Speaker driver 86 may, for example, be coupled to or include a conductive contact 112 (e.g., a conductive lead formed from a conductive material such as a folded or bent piece of metal, a conductive spring, a conductive wire, etc.). Conductive contact 112 may be coupled to conductive traces 110 by conductive interconnect structures 102. Conductive interconnect structures 102 and conductive contact 112 may provide audio signals, control signals, or other signals from conductive traces 110 to speaker driver 86 in speaker 80 (e.g., to drive speaker driver 86 to produce acoustic sound using speaker 80). An end of conductive contact 112 may, for example, extend through an opening 114 in printed circuit 90 and into conductive interconnect structures 102. Conductive interconnect structures 102 may include, for example, conductive flanges and solder that mechanically and electrically couples conductive contact 112 to conductive traces 110.

The conductive traces on printed circuit 90 may also include ground traces 94 (e.g., forming part of the ground conductor for the transmission line path and/or other ground traces held at a ground potential). A tuner for antenna 40 such as tuner 96 may be mounted to printed circuit 90. Tuner 96 may be coupled to ground traces 94. Additionally or alternatively, tuner 96 may be coupled to positive antenna feed terminal 52 over conductive interconnect structure 98. If desired, tuner 96 and/or ground traces 94 may be coupled to conductive support plate 58 via conductive interconnect structure 100. Conductive interconnect structures 98 and 100 may each include conductive traces, conductive pins, conductive springs, conductive prongs, conductive brackets, conductive screws, conductive clips, conductive tape, conductive wires, conductive traces, conductive foam, conductive adhesive, solder, welds, metal members (e.g., sheet metal members), contact pads, conductive vias, conductive portions of one or more components, and/or any other desired conductive interconnect structures. The conductive traces on printed circuit 90 may include a signal conductor of the transmission line path for antenna 40. Tuner 96 may couple positive antenna feed terminal 52 to the signal conductor. Tuner 96 may couple conductive support plate 58 to ground traces 94 if desired. The ground antenna feed terminal for antenna 40 may, for example, be located at tuner 96 and/or printed circuit 90.

Tuner 96 may include one or more tuning elements (e.g., aperture tuners), impedance matching circuitry, radio-frequency couplers, switches, signal lines, ground paths, filter circuitry, resistors, inductors (e.g., fixed or adjustable inductors), capacitors (e.g., fixed or adjustable capacitors), and/or any other desired radio-frequency circuitry for tuning, adjusting, and/or affecting the radio-frequency performance or frequency response of antenna 40. Some or all of the components in tuner 96 may be mounted to printed circuit 90 using surface mount technology (SMT) (e.g., some or all of the components in tuner 96 may be SMT components). The components of tuner 96 may be enclosed within an electromagnetic shield, an encapsulation layer, and/or a protective overmold (e.g., an injection-molded plastic cap). Tuner 96 may receive control signals over one or more control lines on printed circuit 90. The control signals may adjust one or more components of tuner 96 (e.g., may adjust the state of switching circuitry in tuner 96, may adjust the inductance of an adjustable inductor in tuner 96, may adjust the capacitance of an adjustable capacitor in tuner 96, etc.). Tuner 96 may be used to tune the frequency response of antenna 40 and the control signals may be used to change the frequency response of antenna 40 over time, for example.

To optimize the wireless performance of antenna 40, ground traces 94 may be electrically coupled to mid-chassis 65 and display module 62 (thereby extending the antenna ground for antenna 40). As shown in FIG. 6, ground traces 94 on printed circuit 90 may be coupled to mid-chassis 65 by a conductive contact such as conductive spring 104. Printed circuit 90 may include a hole or opening such as opening 92. Conductive spring 104 may be aligned with and at least partially disposed within opening 92. Conductive interconnect structures 102 (e.g., similar conductive interconnect structures to those used to couple conductive contact 112 to conductive traces 110) may be used to electrically couple conductive spring 104 to ground traces 94. Conductive interconnect structures 102 may also mechanically attach or secure the end of conductive spring 104 to printed circuit 90. Conductive interconnect structures 102 may include, for example, conductive flanges and solder that mechanically and electrically connects conductive spring 104 to ground traces 94 on printed circuit 90.

Conductive spring 104 may extend through speaker 80 to contact mid-chassis 65. A first portion of conductive spring 104 may be mounted to, coupled to, or otherwise integrated into substrate 82. For example, conductive spring 104 may include one or more tabs 113 that are molded into and/or embedded within substrate 82 (e.g., substrate 82 may include injection molded plastic that is molded over tabs 113 of conductive spring 104). This may serve to hold conductive spring 104 in place within speaker 80. If desired, a second portion of conductive spring 104 may be disposed within a cavity in substrate 82 and therefore does not contact substrate 82 (e.g., at mid-chassis 65).

Conductive spring 104 may contact a point on mid-chassis 65. The rigid mechanical connection of conductive spring 104 to printed circuit 90 and/or substrate 82 may configure conductive spring 104 to exert a spring force 106 (e.g., a downward biasing force) against mid-chassis 65. This may help to ensure that there is a robust and reliable electrical connection from ground traces 94 to mid-chassis 65 via conductive spring 104 over time, even as external forces are applied to device 10 during use. Conductive spring 104 may include a pogo pin, a leaf spring, a coil spring, or a goose neck spring, as examples. Conductive spring 104 may be formed from metal (e.g., a bent of folded piece of sheet metal, metal pogo pin members, etc.).

A conductive interconnect structure 63 may couple mid-chassis 65 to display module 62 at or near conductive spring 104. In this way, the antenna resonating element 45 (FIG. 3) for antenna 40 (e.g., the segment of peripheral conductive housing structures 12W) may be coupled to the antenna ground 49 (FIG. 3) for antenna 40 as close to the antenna resonating element as possible despite the presence of speaker 80 overlapping the volume of antenna 40. At the same time, conductive spring 104 may serve to extend the antenna ground to include mid-chassis 65 and display module 62 in addition to ground traces 94 and conductive support plate 58, thereby serving to optimize the wireless performance of antenna 40.

The tip of conductive spring 104 may be pressed against mid-chassis 65 (e.g., while exerting spring force 106 against mid-chassis 65) without being soldered, welded, or otherwise affixed to mid-chassis 65. Some materials form better electrical connections to conductive springs or other structures that create an electrical connection via application of a biasing force than other materials. Materials such as gold or nickel-plated stainless steel may, for example, form superior electrical connections to conductive springs than aluminum. In some implementations, mid-chassis 65 is formed using a material that exhibits a relatively weak electrical connection to conductive springs such as aluminum. If desired, a contact pad such as contact pad 108 may be disposed on mid-chassis 65 at or overlapping conductive spring 104.

Contact pad 108 may be electrically and mechanically connected to mid-chassis 65. Conductive spring 104 may touch contact pad 108. Contact pad 108 may therefore electrically couple conductive spring 104 to mid-chassis 65. Contact pad 108 may be formed from a different material than mid-chassis 65. The material used to form contact pad 108 may be selected to form a superior electrical connection from conductive spring 104 to mid-chassis 65 than when conductive spring 104 touches mid-chassis 65 directly. Contact pad 108 may, for example, be formed from gold or nickel-plated stainless steel that is welded to mid-chassis 65 (e.g., an aluminum mid-chassis). This may serve to optimize the electrical connection between conductive spring 104 and mid-chassis 65 (e.g., allowing the free flow of radio-frequency current between conductive ground traces 94 and mid-chassis 65 through speaker 80 via conductive spring 104). Contact pads such as contact pad 108 may be used to couple any desired conductive interconnect structures in device 10 (e.g., conductive springs) to mid-chassis 65 or to any other conductive components that include aluminum.

Figure 7:
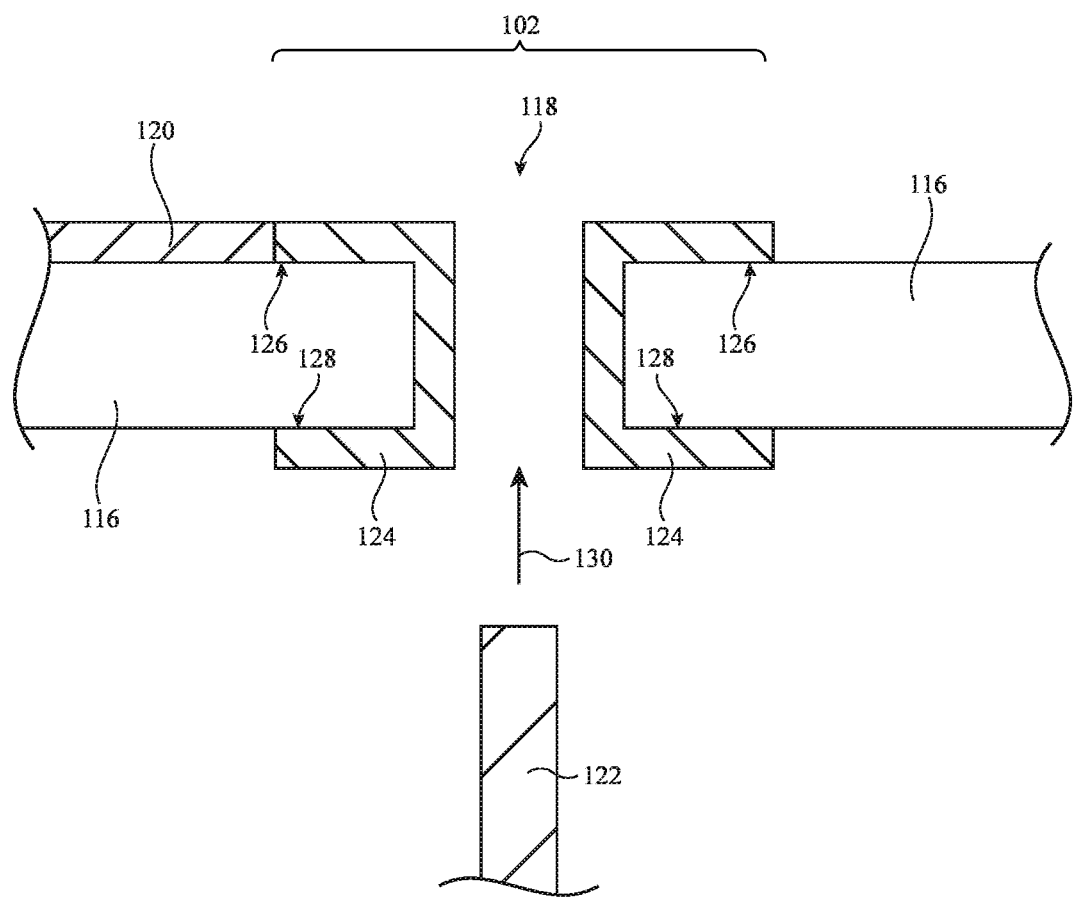
FIG. 7 is a cross-sectional side view showing how a printed circuit may include a copper-plated through via for coupling conductive traces to a conductive contact in accordance with some embodiments.

In some implementations, the conductive interconnect structures 102 used to couple conductive contacts to conductive traces on printed circuit 90 include a copper-plated through via. FIG. 7 is a cross-sectional side view showing one example of how a conductive contact may be coupled to conductive traces on a printed circuit using a copper plated through via.

As shown in FIG. 7, device 10 may include a printed circuit such as printed circuit 116. Printed circuit 116 may be formed from one or more stacked layers of printed circuit material (e.g., rigid printed circuit material or flexible printed circuit material). Printed circuit 116 may be any desired printed circuit in device 10 (e.g., printed circuit 90 of FIG. 6).

Printed circuit 116 may include an opening such as opening 118 (e.g., a hole in printed circuit 116 extending from a first lateral surface 126 to a second lateral surface 128 of printed circuit 116). Opening 118 of FIG. 7 may, for example, form opening 92, opening 114, or another opening in printed circuit 90 (FIG. 6) or in another printed circuit in device 10. Conductive traces 120 may be patterned onto lateral surface 126 of printed circuit 116. Conductive traces 120 may include, for example, ground traces 94 of FIG. 6, conductive traces 110 of FIG. 6, or other conductive traces.

In the example of FIG. 7, opening 118 forms a copper-plated through via. Conductive interconnect structures 102 of FIG. 7 may therefore include copper plating 124 that extends through opening 118 from lateral surface 126 to lateral surface 128. Conductive traces 120 may be coupled to copper plating 124 at lateral surface 126. To couple conductive traces 120 to a conductive contact such as conductive contact 122, the end of conductive contact 122 may be inserted into opening 118, as shown by arrow 130. Solder (not shown in FIG. 7) may then be deposited within opening 118 to mechanically attach the end of contact 122 to copper plating 124, also forming an electrical connection between conductive contact 122 and conductive traces 120 through copper plating 124.

In practice, plated-through hole vias such as the conductive via of FIG. 7 may not be suitable for all printed circuits 116. For example, some printed circuits 116 may be formed from flexible printed circuit material that does not support copper plating 124 in opening 118, such as liquid crystal polymer (LCP). In implementations where printed circuit 116 includes LCP (e.g., when printed circuit 116 is implemented as an LCP flexible printed circuit board, sometimes referred to herein as an LCP flex), conductive interconnect structures 102 may include one or more conductive flanges that couple conductive contact 122 to conductive traces 120.

Figure 8:
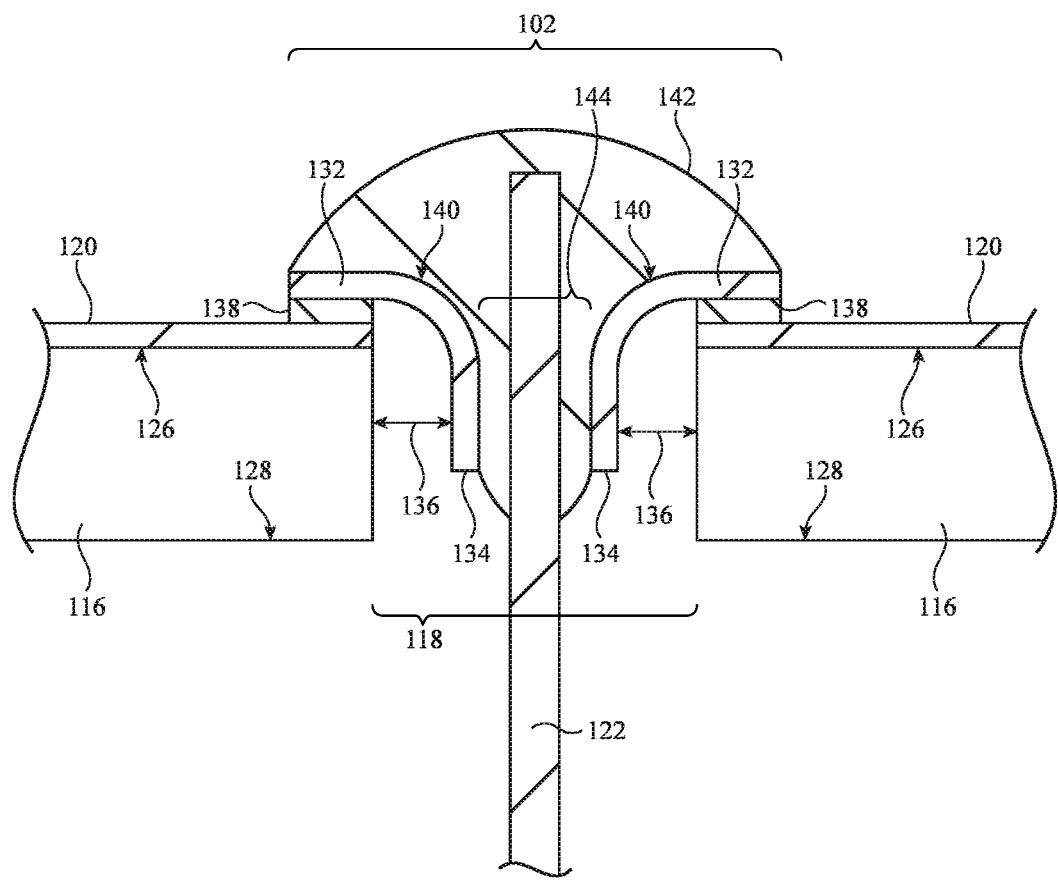
FIG. 8 is a cross-sectional side view showing how an illustrative conductive contact may be coupled to conductive traces on a printed circuit using conductive flanges and solder in accordance with some embodiments.

FIG. 8 is a cross-sectional side view showing how conductive interconnect structures 102 may include conductive flanges that couple conductive contact 122 to conductive traces 120. As shown in FIG. 7, conductive contact 122 may have a first end that is inserted or disposed within (e.g., protruding through) opening 118 of printed circuit 116. Conductive contact 122 may have an opposing second end (not shown) coupled to a first conductive structure (e.g., a conductive portion of a first electrical component).

Conductive contact 122, conductive interconnect structures 102, and conductive traces 120 may electrically couple the first conductive structure to a second conductive structure (e.g., a conductive portion of a second electrical component). The first and second electrical components may be any desired electrical components, devices, or circuitry on or within device 10. The first and second conductive structures (electrical components) may include conductive portions of housing 12 (FIG. 1), speaker 80 (FIG. 6), one or more antennas 40 (FIGS. 2, 3, 5, and 6), input-output devices 28 (FIG. 1), or any other desired conductive structures in or on device 10.

Conductive contact 122 of FIG. 8 may, for example, form conductive contact 112 for speaker driver 86 (FIG. 6) (e.g., conductive traces 120 may form conductive traces 110 and the second end of conductive contact 122 may contact speaker driver 86 of FIG. 6), conductive spring 104 for antenna 40 (FIG. 6) (e.g., conductive traces 120 may form ground traces 94 and the second end of conductive contact 122 may contact mid-chassis 65 of FIG. 6), and/or a conductive contact for any other desired electrical or conductive component (structure) in device 10 (e.g., a conductive contact that electrically couplers a first conductive structure to a second conductive structure). Conductive contact 122 may sometimes also be referred to herein as a conductive lead (e.g., a speaker lead for speaker 80 or a contact lead for another electrical component). Conductive contact 122 may be formed from sheet metal (e.g., folded or bent sheet metal), a conductive spring, a conductive pin, a conductive prong, conductive wire, or any other desired conductive member.

As shown in FIG. 8, conductive interconnect structures 102 may include one or more conductive (metal) flanges 132 that are soldered (surface-mounted) to conductive traces 120 using solder 138. Conductive flange 132 may be formed from bent or folded piece of metal (e.g., sheet metal), as one example. Conductive flange 132 may sometimes also be referred to herein as conductive clip 132, conductive finger 132, conductive tab 132, conductive member 132, or conductive prong 132. Conductive flange 132 may at least partially overlap opening 118. Conductive flange 132 may have a first (lateral) portion (end) 140 that lies substantially parallel to lateral surface 126 of printed circuit 116. Portion 140 may be mounted to conductive traces 120 using solder 138 (e.g., using an SMT process). If desired, conductive flange 132 may have a second (vertical) portion (end) 134 that extends from first portion 140 and into opening 118 (e.g., second portion 134 may be formed from a portion of conductive flange 132 that is drawn downwards into opening 118 in printed circuit 116). Portion 134 of conductive flange 132 may be omitted if desired.

Portion 134 of conductive flange 132 may be laterally separated from the sidewalls of opening 118 (e.g., as defined by the LCP material in flexible printed circuit 116) by a non-zero distance 136 (e.g., a gap having a non-zero width of distance 136). If desired, conductive interconnect structures 102 may include multiple discrete conductive flanges 132 disposed at different locations around the lateral periphery of opening 118 (e.g., into and out of the plane of the page, parallel to lateral surface 126). In other implementations, conductive interconnect structures 102 may include a single continuous conductive flange 132 that laterally extends around the entire lateral periphery of opening 118 (e.g., at lateral surface 126 of printed circuit 116) and that is optionally drawn downwards into opening 118 from around the entire lateral periphery of opening 118. The conductive flange(s) 132 in conductive interconnect structure 132 may laterally surround a central opening (gap) 144 (e.g., where portion 134 of conductive flange(s) 132 are laterally interposed between central opening 144 and the sidewalls of opening 118).

The first end of conductive contact 122 may be inserted into central opening 144 and may extend through central opening 144 from lateral surface 128 to a location near, at, or beyond lateral surface 126 of printed circuit 116. Conductive interconnect structures 102 may include solder 142 that is deposited onto conductive contact 122 and conductive flange(s) 132. Solder 142 may wick down conductive contact 122 to couple substantially all of portion 134 of conductive flange(s) 132 to conductive contact 122 (e.g., solder 142 may fill central opening 144 and may cover the first end of conductive contact 122 and portion 140 of conductive flange(s) 132). The portion of opening 118 between conductive flanges 132 and the sidewalls of opening 118 (e.g., as shown by distance 136) may be free from solder, for example.

After deposition, solder 142 may solidify to form a rigid and robust mechanical connection between the first end of conductive contact 122 and conductive flange(s) 132. Solder 142 and conductive flange(s) 132 may serve to hold conductive contact 122 in place within opening 118 of printed circuit 116 (e.g., may provide a rigid mechanical coupling between conductive contact 122 and printed circuit 116). At the same time, solder 138, conductive flanges 132, and solder 142 may electrically couple conductive traces 120 to conductive contact 122. As such, electrical signals (e.g., current or voltage) may pass between conductive traces 120 and conductive contact 122. The electrical signals may include radio-frequency signals (e.g., antenna currents), power signals (e.g., a power supply voltage that powers one or more components in device 10), control signals (e.g., that control the operation of one or more components in device 10), audio signals (e.g., that drive speaker driver 86 of FIG. 6), and/or any other desired signals. While contact 122 is shown in FIG. 8 as being inserted from lateral surface 128 towards lateral surface 126 of printed circuit 116, conductive contact 122 may, if desired, be inserted in the opposite direction from lateral surface 126 towards lateral surface 128 (e.g., conductive contact 122 may be inserted into printed circuit 116 from the same side of the printed circuit as conductive flange(s) 132).

Figure 9:
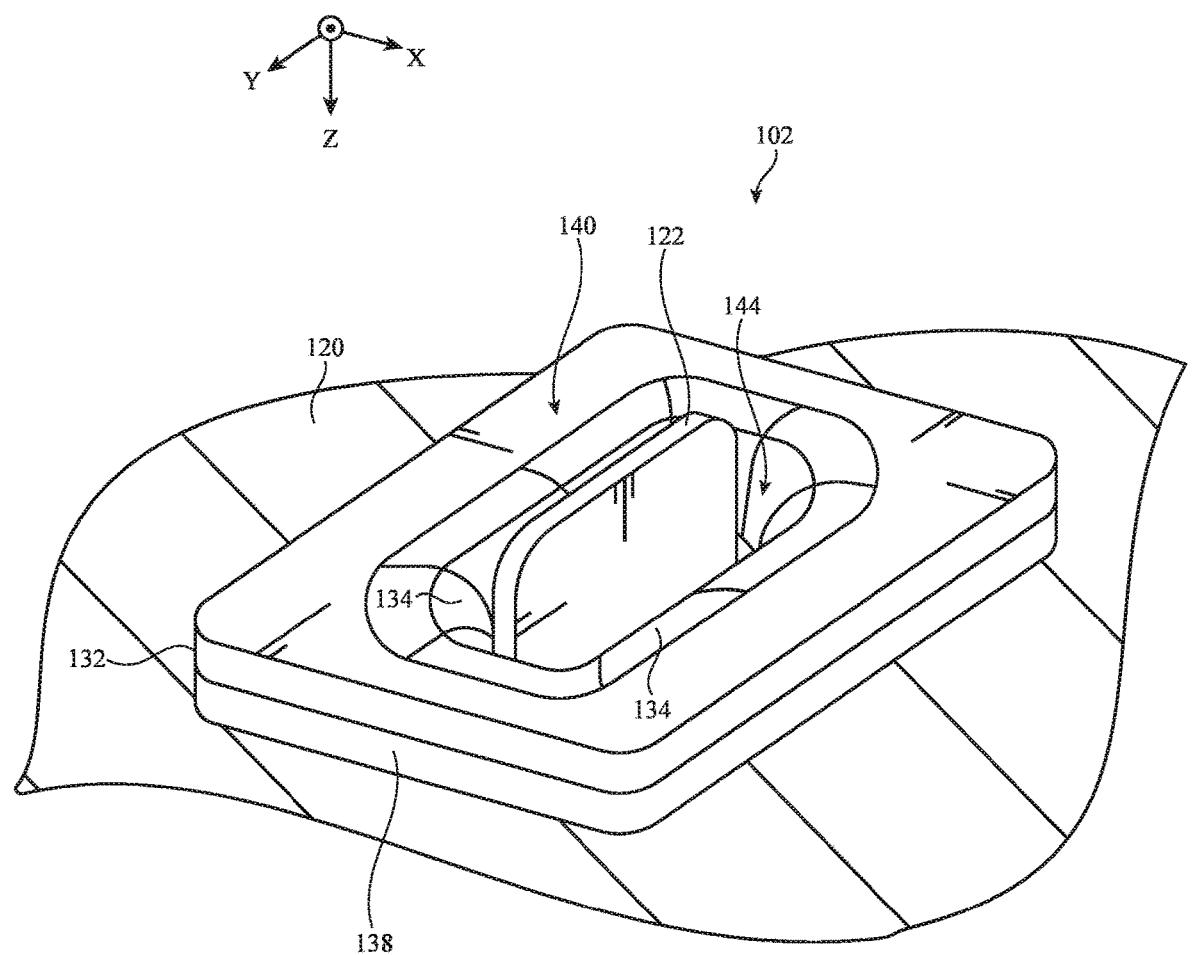
FIG. 9 is a perspective view showing how an illustrative conductive contact may be inserted between conductive flanges soldered to conductive traces on a printed circuit in accordance with some embodiments.

FIG. 9 is a perspective view showing one example of how conductive interconnect structures 102 may include a single conductive flange 132 that laterally extends around the entire lateral periphery of opening 118 in printed circuit 116 of FIG. 8. As shown in FIG. 9, portion 140 of conductive flange 132 may be coupled to conductive traces 120 by solder 138 (e.g., a ring of solder laterally surrounding opening 118 of FIG. 8, which is not shown in FIG. 9 for the sake of clarity). Portion 134 of conductive flange 132 may extend downwards into the opening around the entire lateral periphery of the opening. Portion 134 of conductive flange 132 may laterally surround central opening 144. The first end of conductive contact 122 may be inserted into central opening 144 and may be laterally surrounded by portion 134 of conductive flange 132.

Solder 142 (FIG. 8) may be deposited within central opening 144 and over conductive contact 122 (not shown in FIG. 9 for the sake of clarity). The solder may mechanically secure conductive contact 122 to conductive flange 132. The solder may also electrically couple conductive contact 122 (and thus any electrical components coupled to the second end of conductive contact 122, not shown in FIG. 9) to conductive traces 120 (and thus to any electrical components coupled to conductive traces 120). The example of FIG. 9 is merely illustrative and, in general, conductive flange 132 may have other shapes and/or more than one conductive flange may be disposed within opening 118 of printed circuit 116 (FIG. 8). In this way, conductive contact 122 may form a mechanically and electrically robust connection between a conductive component and conductive traces 120 on printed circuit 116 even when printed circuit 116 is formed from LCP.

Device 10 may gather and/or use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is merely illustrative and various modifications can be made by those skilled in the art without departing from the scope and spirit of the described embodiments. The foregoing embodiments may be implemented individually or in any combination.

What is claimed is:

1. An electronic device comprising: a printed circuit having a hole; a conductive trace on the printed circuit; a conductive flange soldered to the conductive trace and at least partially overlapping the hole, wherein the conductive flange has a first portion soldered to the conductive trace and a second portion that extends from the first portion and into the hole in the printed circuit; a conductive contact that extends into the hole; and solder that couples the conductive contact to the conductive flange.

2. The electronic device of claim 1, further comprising: a speaker driver coupled to the conductive contact, wherein the conductive trace, the conductive flange, and the conductive contact are configured to convey an audio signal to the speaker driver.

3. The electronic device of claim 1, further comprising: an antenna having an antenna ground, the conductive trace forming part of the antenna ground; and a conductive housing layer, wherein the conductive contact is pressed against the conductive housing layer.

4. The electronic device of claim 3, further comprising: peripheral conductive housing structures having a segment that forms an antenna resonating element for the antenna;
a display mounted to the peripheral conductive housing structures; and a rear housing wall mounted to the peripheral conductive housing structures opposite the display, wherein the conductive housing layer is interposed between the printed circuit and the display.

5. The electronic device of claim 1, wherein the printed circuit comprises a flexible printed circuit.

6. The electronic device of claim 5, wherein the flexible printed circuit comprises liquid crystal polymer (LCP).

7. The electronic device of claim 1, wherein the second portion of the conductive flange is separated from a sidewall of the hole by a gap having a non-zero width.

8. The electronic device of claim 7, wherein the conductive flange laterally extends around a lateral periphery of the hole, the second portion of the conductive flange laterally surrounds a central opening within the hole in the printed circuit, the conductive contact extends into the central opening, and the solder fills the central opening.

9. The electronic device of claim 7, wherein the gap is free from solder.

10. Apparatus comprising: a liquid crystal polymer (LCP) printed circuit having an opening; a conductive trace on the LCP printed circuit; a bent piece of metal mounted to the conductive trace, wherein the bent piece of metal has an end that extends into the opening; a conductive contact having a portion that is disposed in the opening; and
solder that couples the conductive contact to the bent piece of metal.

11. The apparatus of claim 10, wherein the bent piece of metal is soldered to the conductive trace.

12. The apparatus of claim 10, wherein the bent piece of metal extends around a lateral periphery of the opening and the end of the bent piece of metal laterally surrounds a central opening within the opening in the LCP printed circuit, the portion of the conductive contact being disposed in the central opening.

13. The apparatus of claim 12, wherein the end of the bent piece of metal that extends into the opening is laterally separated from a sidewall of the opening by a gap having a non-zero width, the end of the bent piece of metal being laterally interposed between the central opening and the gap.

14. The apparatus of claim 13, wherein the gap is free from solder.

15. The apparatus of claim 10, wherein the conductive contact comprises a conductive spring.

16. The apparatus of claim 10, wherein the conductive contact comprises a speaker lead.

17. The apparatus of claim 10, wherein the conductive trace, the bent piece of metal, and the conductive contact are configured to convey radio-frequency antenna current between a first conductive structure and a second conductive structure.

18. An electronic device comprising: a flexible printed circuit having a first hole and a second hole; conductive traces on the flexible printed circuit; a first metal clip soldered to the conductive traces and extending into the first hole; a conductive spring having an end disposed within the first hole; first solder that couples the end of the conductive spring to the first metal clip; a second metal clip soldered to the conductive traces and extending into the second hole; a conductive contact having an end disposed within the second hole; and second solder that couples the end of the conductive contact to the second metal clip.

19. The electronic device of claim 18, further comprising: an antenna; and a speaker driver coupled to the conductive contact, wherein the first metal clip and the conductive spring form part of an antenna ground for the antenna.

\* \* \* \* \*